(12) United States Patent
Park et al.

(10) Patent No.: US 8,009,488 B2
(45) Date of Patent: Aug. 30, 2011

(54) SEMICONDUCTOR MEMORY DEVICE

(75) Inventors: Duk-Ha Park, Suwon-si (KR);
Ki-Whan Song, Yongin-si (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 140 days.

(21) Appl. No.: 12/385,198

(22) Filed: Apr. 1, 2009

(65) Prior Publication Data

US 2009/0262587 A1    Oct. 22, 2009

(30) Foreign Application Priority Data

Apr. 18, 2008 (KR) .................. 10-2008-0036026

(51) Int. Cl.
*G11C 7/02* (2006.01)
*G11C 7/06* (2006.01)

(52) U.S. Cl. .............. 365/189.09; 365/230.03; 365/203; 365/207; 365/189.07; 365/210.1

(58) Field of Classification Search .................. None
See application file for complete search history.

(56) References Cited

U.S. PATENT DOCUMENTS

| | | | |
|---|---|---|---|
| 6,809,576 B1 | 10/2004 | Yamasaki | |
| 7,027,334 B2 | 4/2006 | Ikehashi et al. | |
| 7,511,982 B2 * | 3/2009 | Kurjanowicz et al. | 365/96 |
| 2007/0025146 A1 * | 2/2007 | Huang | 365/185.2 |
| 2007/0189068 A1 | 8/2007 | Lee | |
| 2007/0189094 A1 * | 8/2007 | Ohsawa | 365/210 |
| 2008/0170444 A1 * | 7/2008 | Hoenigschmid | 365/185.33 |

FOREIGN PATENT DOCUMENTS

| | | |
|---|---|---|
| JP | 11-213664 A | 8/1999 |
| JP | 2004-335883 A | 11/2004 |
| KR | 10-2004-0096781 A | 11/2004 |
| KR | 10-0675299 B1 | 1/2007 |

* cited by examiner

*Primary Examiner* — Hoai V Ho
*Assistant Examiner* — James G Norman
(74) *Attorney, Agent, or Firm* — Lee & Morse, P.C.

(57) ABSTRACT

A semiconductor memory device includes a plurality of memory cell array blocks connected to word lines, source lines, and bit lines, each memory cell array including memory cells each having a transistor with a floating body, a reference voltage generator configured to have a reference memory cell and generate a reference voltage for bit line sensing corresponding to a current flowing into a reference memory cell during a data read operation, first and second prechargers configured to precharge a bit line connected to non-selected memory cells to the reference voltage in response to first and second precharge control signals during the data read operation, and a sense amplifier configured to sense and amplify a voltage difference between a bit line connected to the selected memory cells and a bit line connected to the non-selected memory cells during the data read operation.

20 Claims, 8 Drawing Sheets

SEMICONDUCTOR MEMORY DEVICE

BACKGROUND

1. Field

Example embodiments relate to a semiconductor memory device, and more particularly, to a semiconductor memory device that includes a memory cell array with a floating body transistor using a bipolar junction transistor operation, and writes and reads data by generating a variable reference voltage.

2. Description of Related Art

In general, a dynamic memory cell includes one access transistor and one data storage capacitor. Data "1" is stored when charges are stored in the capacitor and data "0" is stored when no charge is stored in the capacitor. Since the charges stored in the capacitor are lost after a given time has elapsed, a refresh operation should be performed. When a memory cell array is configured with the memory cell, there is a limit to reducing a layout area of a semiconductor memory device.

To reduce the layout area of the semiconductor memory device, a transistor with a floating body has been recently proposed. This transistor stores majority carriers in the floating body. Since the stored majority carriers are also lost when a given time has elapsed, a refresh operation should be performed. Since a memory cell configured by the transistor with the floating body does not have a capacitor, as opposed to a general memory cell, but still operates like the capacitor, such a memory cell is used as a dynamic memory cell. A semiconductor memory device with such a dynamic memory cell has a smaller layout area than a semiconductor memory device with the general memory cell.

There are ongoing efforts to increase the operation speed and data retention characteristics of a memory cell array with a dynamic memory cell using a floating body transistor by using a bipolar junction transistor operation of the floating body transistor.

FIG. 1 illustrates an equivalent circuit diagram of a structure of a conventional floating body transistor. The floating body transistor includes an n-channel metal oxide semiconductor (NMOS) field-effect transistor (hereinafter, referred to as an NMOS transistor) and an NPN bipolar junction transistor (hereinafter, referred to as an NPN transistor). A source S of the NMOS transistor and an emitter E of the NPN transistor are shared. A drain D of the NMOS transistor and a collector C of the NPN transistor are shared. A base B of the NPN transistor is floated. A coupling capacitor CC exists between a gate G and a base B of the NMOS transistor.

A data "1" state is a state in which majority carriers, i.e., holes, are accumulated in a floating body region. A data "0" state is a state in which minority carriers, i.e., electrons, are accumulated in the floating body region.

When a gate voltage Vg is 0 V, the floating body transistor has a rapid current increase before a voltage Vds between the drain and the source is equal to or higher than a predetermined level, regardless of the data "1" or "0" state. According to the above-described rapid current increase, holes enter the base B by initial drain coupling when a voltage difference Vds between the drain and the source is more than a given voltage. When a potential of the base region increases, a forward voltage is applied between the base B and the emitter E, inducing an emitter current. A large emitter current flows into the collector C. This current passes through a band bending region between the base B and the collector C, leading to band-to-band tunneling and/or impact ionization.

Holes are injected from the collector C to the base B by the band-to-band tunneling and/or impact ionization, causing the potential of the base B to increase once more. When the voltage Vds between the drain and the source increases and the NPN transistor is turned on, a bipolar current Ids is rapidly increased by a forward feedback system of the NPN transistor itself. When a multiplication factor is increased by the impact ionization, the bipolar current Ids may be increased rapidly.

In the case of a negative gate voltage Vg, compared with the gate voltage Vg of 0 V, the bipolar current increases rapidly at a relatively high voltage Vds between the drain and the source. When the gate voltage Vg decreases, a positive electric potential of the base decreases. Accordingly, the NPN transistor may be turned on by the band-to-band tunneling and/or impact ionization only when the voltage Vds between the drain and the source increases.

Meanwhile, another topic of active research is a bit line sense amplification circuit for performing a bipolar junction transistor operation and a semiconductor memory device for securing a margin capable of sensing a current difference by adaptively varying a data ground voltage of a memory cell according to ambient temperature variation, among semiconductor memory devices that have a memory cell with a floating body and perform data write and read operations.

FIG. 2 illustrates a partial block diagram of data write and read operations of a conventional semiconductor memory device including a memory cell with a floating body. The conventional semiconductor memory device includes a memory cell array block BLK1, a bit line selector 10-11, a reference bit line selector 12-1, level limiters 14-1 to 14-(m-1), a sense amplifier 16-1, a reference voltage generator 18, a comparator COM1, a latch LA1, a write back gate WBG1, a read column select gate RG1, a write column select gate WG1, and a reference write column select gate RWG.

In FIG. 2, only some components are shown while others have been omitted for convenience. In FIG. 2, only bit lines BL1 to BLj, which may be open or folded type bit lines, are arranged to the left of the sense amplifier, and inverted bit lines BL1B to BLjB have been omitted.

Now, write and read operations of the semiconductor memory device shown in FIG. 2 will be described.

First, a write operation of reference memory cells RMC will be described.

When a word line WL11 is activated, a voltage of about 1.5 V is applied, and a reference bit line select signal RBS1 is activated, a reference bit line RBL1 is connected to a reference sense bit line RSBL. When a reference write column select signal RWCSL is activated, an NMOS transistor N7 is turned on and therefore data to be output to a write data line WD is output to the reference bit line RBL1 through the reference sense bit line RSBL. Data "1" is written to all reference memory cells RMC connected between word lines WL11 and WL21 and reference bit lines RBL2.

In order to generate a reference voltage VREF during a data read operation, data "0" is written to reference memory cells RMC connected to the reference bit line RBL1 of each of reference memory cell array blocks RBLK1 and RBLK2, and data "1" is written to reference memory cells RMC connected to the reference bit line RBL2.

Next, a write operation of memory cells MC will be described.

When a voltage of about 1.5 V is applied to the word line WL11 and a bit line select signal BS1 is activated, a bit line BL1 is connected to a sense bit line SBL1. When a write column select signal WCSL1 is activated, an NMOS transistor N6 is turned on. When a voltage of −1.5 V is applied to a write data line WD, this voltage is output to the bit line BL1 through the sense bit line SBL1 and data "0" is written to a memory cell MC between the word line WL11 and the bit line BL1. When a voltage of 1.5 V is applied to the write data line WD, data "1" is written.

Now, a read operation of the memory cells MC will be described.

When a voltage of about 1.5 V is applied to the word line WL11 and the bit line select signal BS1 is activated, the bit line BL1 is connected to the sense bit line SBL1 and a signal is output from the bit line BL1 to the sense bit line SBL1. At this time, the reference bit line select signals RBS1 and RBS2 are simultaneously activated. Accordingly, the reference bit lines RBL1 and RBL2 are connected to the reference sense bit line RSBL and signals are output from the reference bit lines RBL1 and RBL2 to the reference sense bit line RSBL.

The level limiter 14-1 prevents a current from flowing from an output node "a1" to the sense bit line SBL1 when a voltage of the sense bit line SBL1 is higher than a limited voltage VBLR due to a current flowing into the sense bit line SBL1, thereby enabling the sense bit line SBL1 to be maintained at a voltage less than the limited voltage VBLR. When a current Ic1 corresponding to data stored in the memory cell MC is generated, the sense amplifier 16-1 senses the current Ic1 and generates a sensed voltage Sn1.

When the reference voltage generator 18 senses the current Ic(m+1) and generates a reference voltage VREF between a voltage corresponding to the data "0" and a voltage corresponding to the data "1" output from the sense amplifier 16-1, the comparator COM1 is enabled in response to a sense-amplifier enable signal SEN, compares the sensed voltage Sn1 generated by the sense amplifier 16-1 with the reference voltage VREF, and generates sensed data.

That is, when the sensed voltage Sn1 generated by the sense amplifier 16-1 is lower than the reference voltage VREF, the comparator COM1 outputs a high-level signal to a corresponding node "a". Conversely, when the sensed voltage Sn1 is higher than the reference voltage VREF, the comparator COM1 outputs a low-level signal to the corresponding node "a".

The latch LA1 latches the sensed data. When a read column select signal RCSL1 is activated, NMOS transistors N2 and N4 are turned on. In this case, when the node "a" is at a high level, an NMOS transistor N5 is turned on and outputs low-level data to an inverted read data line RDB. Meanwhile, when a node "b" is at a high level, an NMOS transistor N3 is turned on and outputs the low-level data to a read data line RD. That is, the low-level data is output to the read data line RD or the inverted read data line RDB during the read operation.

In a conventional semiconductor memory device that includes a memory cell with a floating body and performs data write and read operations, there is a problem in that the size of a bit line sense amplifier must be increased to generate a reference voltage for bit line sense amplification when a reference voltage generator is included in the bit line sense amplifier, and the size of a memory array increases since a dummy cell configured with reference memory cells RMC is added to the memory array.

There is another problem in that a control operation for enabling a dummy cell is additionally needed to enable reference memory cells RMC, and complex circuits of a level limiter, a comparator, a latch, a write back gate, a read column select gate RG1, a write column select gate WG1, a reference write column select gate RWG, etc. are needed for the data read operation.

Meanwhile, since a reference voltage generation method of the conventional floating body transistor is not adaptive to variation of drain-source current Ids because a fixed voltage value of a middle level between an internal voltage VINTA and a ground voltage VSS is used as a reference voltage of bit line sensing, a bit line sense amplifier may not stably and accurately detect a current difference.

Even when direct current (DC) characteristics of a floating body transistor are varied in an abnormal situation in which an ambient temperature is significantly different from room temperature, the semiconductor memory device uses a fixed voltage value as a reference voltage for bit line sensing regardless of variation in the ambient temperature. Accordingly, since a margin of a difference between drain-source currents for generating the data "0" and the data "1" is very small, it is difficult to secure a sufficient margin capable of stably sensing the current difference. Therefore, there is a problem in that a read operation of the semiconductor memory device may malfunction.

SUMMARY

Example embodiments are therefore directed to a semiconductor memory device, which substantially overcomes one or more of the disadvantages of the related art.

It is therefore a feature of an embodiment to provide a semiconductor memory device that can secure a sufficient margin capable of sensing a voltage difference for bit line sensing according to variation of drain-source current.

It is therefore another feature of an embodiment to provide a semiconductor memory device that can secure a sufficient margin capable of sensing a voltage difference for bit line sensing according to variation of ambient temperature.

At least one of the above and other features and advantage may be realized by providing a semiconductor memory device including a plurality of memory cell array blocks connected to word lines, source lines and bit lines, each memory cell array block including memory cells each having a transistor with a floating body and being configured to write/read data by performing a bipolar junction transistor operation for selected memory cells, a reference voltage generator configured to have a reference memory cell and generate a reference voltage for bit line sensing corresponding to a current flowing into a reference memory cell during a data read operation, first and second prechargers configured to precharge a bit line connected to non-selected memory cells to the reference voltage in response to first and second precharge control signals during the data read operation, and a sense amplifier configured to sense and amplify a voltage difference between a bit line connected to the selected memory cells and the bit line connected to the non-selected memory cells during the data read operation.

The semiconductor memory device may further include an internal voltage precharger configured to precharge a bit line pair of the bit line connected to the selected memory cells and the bit line connected to the non-selected memory cells to an internal voltage in response to a precharge control signal, a ground voltage precharger configured to precharge the bit line pair to a ground voltage in response to a read precharge control signal, and a column select gate configured to output data between the bit line pair and a data line pair in response to a column select signal.

The semiconductor memory device may further include first and second precharge controllers configured to receive the first and second precharge control signals and a column select signal pulse, activate the first and second prechargers only when both the first precharge control signal and the column select signal pulse, or the second precharge control signal and the column select signal pulse, are applied at the high level, and output first and second precharge enable signals for writing and reading only data of a selected bit line pair.

The reference voltage generator may include a target reference voltage generator configured to receive a source line voltage and generate a target reference voltage in response to a word line signal, and a comparator configured to receive the target reference voltage and a presently operating bit line precharge voltage, compare the two voltages, and output a variable bit line precharge voltage as the reference voltage.

The target reference voltage generator may include a reference memory cell configured to receive the source line voltage at a first terminal, receive the word line signal through a gate terminal, induce a current at a second terminal and write and read data, and a plurality of resistors connected in series between the reference memory cell and a ground, the plurality of resistors being configured to receive the current, distribute a voltage, and generate the target reference voltage.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF THE INVENTION

Figure 1:
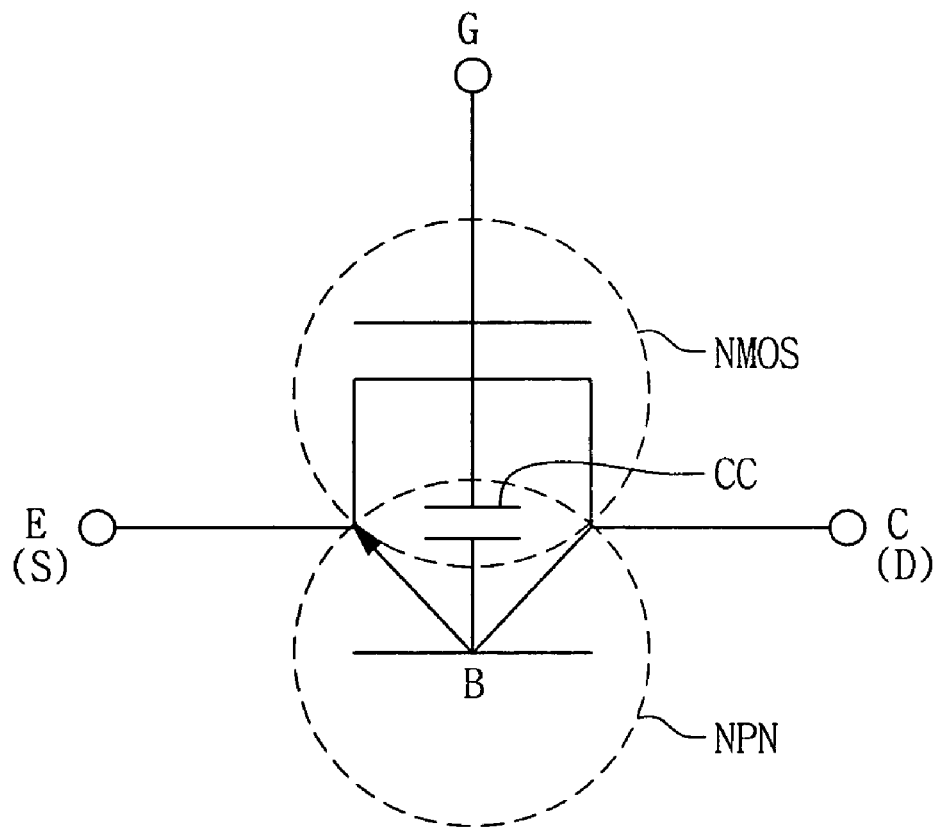
FIG. 1 illustrates an equivalent circuit diagram of a structure of a conventional floating body transistor.

Korean Patent Application No. 10-2008-0036026, filed on Apr. 18, 2008, in the Korean Intellectual Property Office, and entitled: "Semiconductor Memory Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

As described in detail below, according to example embodiments, a semiconductor memory device may reduce the size of a bit line sense amplifier and the size of a memory array since a reference voltage generator is not included in the bit line amplifier and a dummy cell configured with reference memory cells is not needed. Further, according to example embodiments, a semiconductor memory device may perform a data read operation that is adaptive to variation of current and variation of ambient temperature with a simple circuit configuration.

Figure 3:
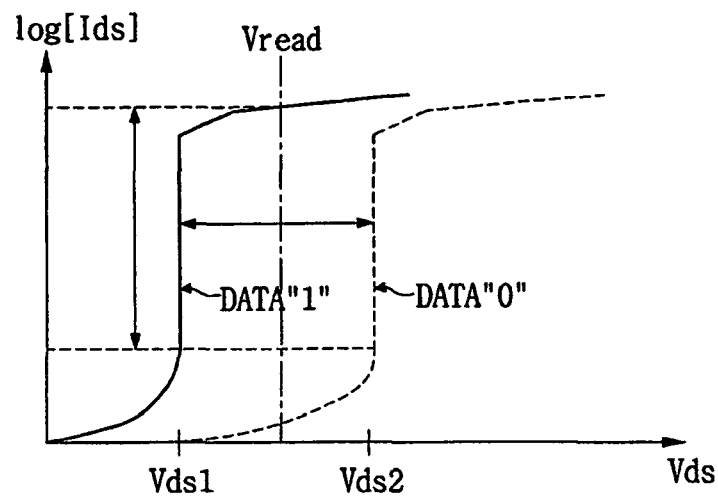
FIG. 3 illustrates a voltage-current characteristic curve of an allowance range of a data ground voltage in a 1T DRAM using a bipolar junction transistor operation.

FIG. 3 illustrates a voltage-current characteristic curve representing an allowance range of a data ground voltage Vread in a 1T DRAM using a bipolar junction transistor operation. Drain-source voltage Vds is plotted on the horizontal axis and the logarithm of drain-source current Ids is plotted on the vertical axis. A solid curve is a voltage-current characteristic curve for generating a data "1" state and a dotted curve is a voltage-current characteristic curve for generating a data "0" state.

As shown in FIG. 3, the voltage-current characteristic curve for generating the data "1" state shows that the drain-source current Ids gradually increases when the drain-source voltage Vds initially increases, and then rapidly increases when the drain-source voltage Vds reaches a first drain-source voltage Vds1. The voltage-current characteristic curve for generating the data '0" state shows that the drain-source current Ids gradually increasing even when the drain-source voltage Vds initially increases, and then rapidly increases when the drain-source voltage Vds reaches a second drain-source voltage Vds2.

In order to secure a margin capable of stably sensing a difference in the current Ids in a sense amplifier, the data ground voltage Vread may take a middle value between the drain-source voltage Vds1 for generating the data "1" state and the drain-source voltage Vds2 for generating the data "0" state. The sense amplifier needs to secure a greater value than an offset voltage as a minimum margin capable of sensing the difference in the current Ids. In other words, the smaller of a voltage difference between the data ground voltage Vread and the drain-source voltage Vds1 for generating the data "1" state and a voltage difference between the data ground voltage Vread and the drain-source voltage Vds2 for generating the data "0" state needs to be greater than the offset voltage of the sense amplifier.

In general, a semiconductor memory device with a floating body transistor using a bipolar junction transistor operation uses a bit line precharge voltage VBL, which is a middle voltage between an internal power supply voltage VINTA and a ground voltage VSS, as a reference voltage for bit line sensing.

In contrast, the bit line sensing of the semiconductor memory device in accordance with embodiments, a reference voltage Vref may be generated by distributing a source line voltage VSL applied to a memory cell during active operation at a given ratio and generating a bit line precharge voltage VBLP for bit line initialization.

Figure 4:
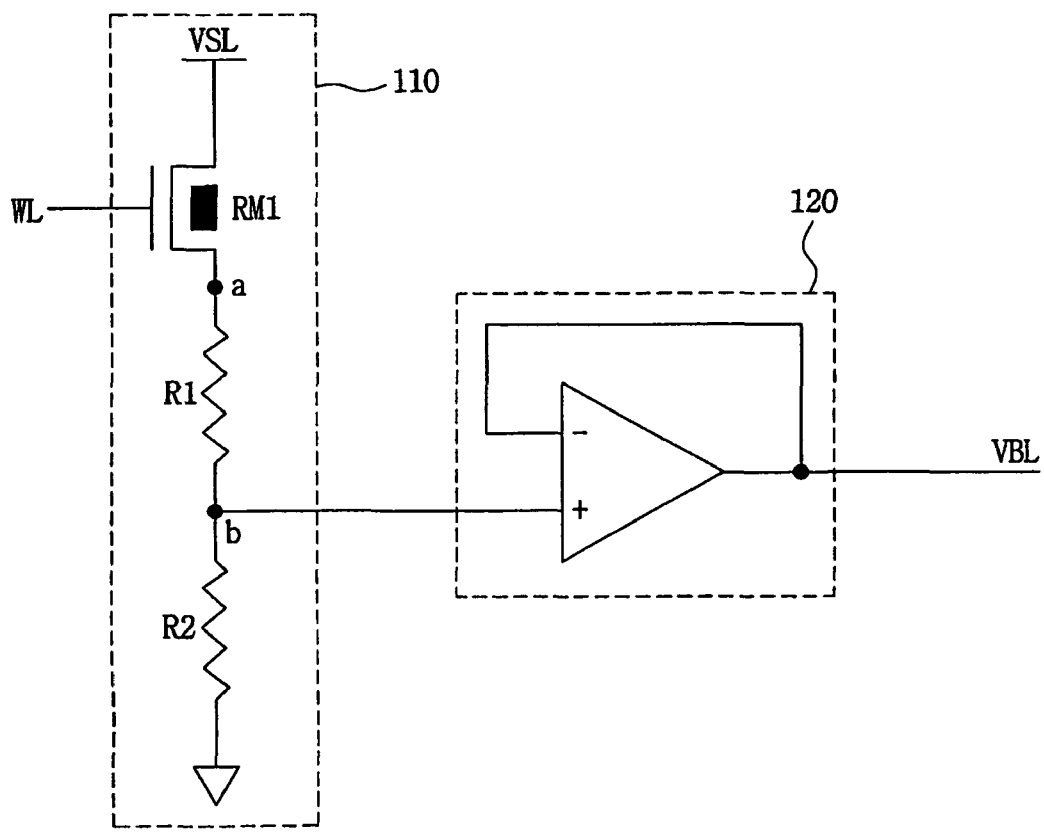
FIG. 4 illustrates a circuit diagram of a reference voltage generator within a semiconductor memory device according to example embodiments.

Next, FIG. 4 illustrates a circuit diagram of a reference voltage generator 100 within a semiconductor memory device according to example embodiments. Functioning of the reference voltage generator 100 within the semiconductor memory device according to example embodiments will be described with reference to FIG. 4.

The reference voltage generator 100 may include a target reference voltage generator 110 and a comparator 120. The target reference voltage generator 110 may include a reference memory cell RM1 configured with an NMOS transistor and two resistors R1 and R2. The NMOS transistor may have a first terminal receiving a source line voltage VSL, a second terminal connected to the two resistors R1 and R2, and a gate terminal receiving a word signal WL. The two resistors R1 and R2 may be connected in series between the reference memory cell RM1 and a ground voltage.

Here, two resistors R1 and R2 are shown for convenience, but at least three resistors maybe used. Also, the resistors may be replaced with a p-channel metal oxide semiconductor (PMOS) or NMOS transistor.

The target reference voltage generator 110 may generate a target reference voltage at a contact point between the resistors R1 and R2 by receiving the source line voltage VSL through the reference memory cell RM1 and inducing the drain-source current Ids in response to a word line signal WL.

The comparator 120 may receive the target reference voltage generated by the target reference voltage generator 110 at a positive terminal thereof, receive an actual bit line precharge voltage VBL actually operating from a precharger (see FIG. 7) at a negative terminal by negative feedback, compare magnitudes of the two voltages, and output a variable bit line precharge voltage VBL as a reference voltage.

Figure 5:
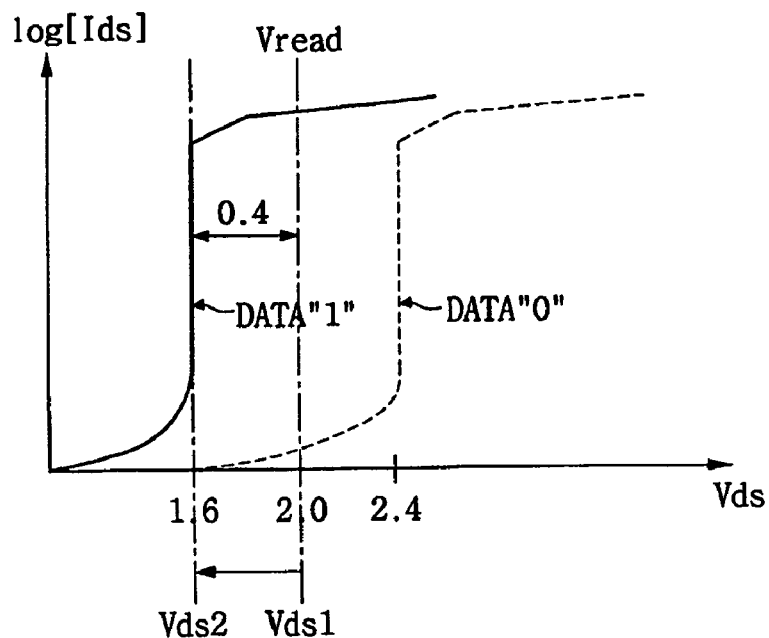
FIG. 5 illustrates a voltage-current curve based on variation of drain-source current of a reference memory cell within the reference voltage generator shown in FIG. 4 according to example embodiments.

Next, FIG. 5 shows a voltage-current curve based on variation of drain-source current of the reference memory cell RM1 within the reference voltage generator shown in FIG. 4 according to example embodiments.

Drain-source voltage Vds is plotted on the horizontal axis and the logarithm of drain-source current Ids is plotted on the vertical axis. A solid curve is a voltage-current characteristic curve for generating a data "1" state and a dotted curve is a voltage-current characteristic curve for generating a data "0" state.

FIG. 5 shows a drain-source current Ids varying with a drain-source voltage Vds of a transistor in the data "1" and "0" states. In this particular example, the drain-source voltage Vds initially starts at a first drain-source voltage Vds1 equal to the source line voltage VSL, e.g., 2.0 V, and decreases to a second drain-source voltage Vds2, e.g., 1.6 V, when the drain-source current Ids of the reference memory cell RM1 within the reference voltage generator 100 of FIG. 4 increases.

Next, an operation of the reference voltage generator 100 will be described with reference to FIGS. 4 and 5. For convenience, it is assumed that the source line voltage VSL is 2 V and the data "1" is written to and read from the reference memory cell RM1.

When the drain-source voltage Vds of 2 V is applied to the NMOS transistor while the data "1" is written and stored in the reference memory cell RM1 within the target reference voltage generator 110, a large current flows into a cell to generate the data "1" state, while substantially no current flows into a cell to generate the data "0" state. The target reference voltage generator 110 may generate a target reference voltage required to read the data "1" using a current characteristic difference based on a drain-source voltage between the cell to generate the data "1" state and the cell to generate the data "0" state.

Initially, a corresponding word line signal WL having a low level may be provided and an NMOS transistor may be maintained in an off state. When a data read condition is reached in response to a data read command Read, the word line signal WL for generating the reference voltage for bit line sensing may be activated and transition to a high level. In response, the NMOS transistor may be turned on to transfer the source line voltage VSL applied to the first terminal and induce the drain-source current Ids. A voltage of a first node "a" at the drain may be raised from the ground voltage.

When the drain-source voltage Vds, which equals the difference between the source line voltage VSL and the voltage of the first node "a", initially starts at 2.0 V, i.e., when the first drain-source voltage Vds1 equals the source line voltage VSL, and gradually decreases to 1.6 V, corresponding to the second drain-source voltage Vds2, no current flows into the cell RM1 to generate the data "1" state. Since the voltage of the first node "a" is no longer raised, the first node "a" has a voltage (0.4 V) corresponding to a difference between the first drain-source voltage Vds1 (2.0 V) and the second drain-source voltage Vds2 (1.6 V) that is relatively decreased due to an increase in the drain-source current Ids of the reference memory cell RM1 in the reference voltage generator 100.

In the target reference voltage generator 110, the two resistors R1 and R2 may receive the voltage of the first node "a" that varies with an increase in the drain-source current Ids from the NMOS transistor, distribute the received voltage at a given ratio, and generate a variable target reference voltage at a second node "b", i.e., a contact point between the two resistors R1 and R2.

The comparator 120 may receive the target reference voltage generated by the target reference voltage generator 110 at the positive terminal, receive the actual bit line precharge voltage VBL actually operating from the precharger (see FIG. 7) by negative feedback at the negative terminal, and compare magnitudes of the two voltages.

When the target reference voltage is higher than the actually operating bit line precharge voltage VBL, i.e., when the voltage of the first node "a" is higher than the drain-source voltage Vds, an increased bit line precharge voltage VBL may be output by the comparator 120. When the target reference voltage is less than the actually operating bit line precharge voltage VBL, i.e., when the voltage of the first node "a" is less than the drain-source voltage Vds, a decreased bit line precharge voltage VBL may be output by the comparator 120.

Unlike the conventional reference voltage generator using a fixed voltage at a middle level between an internal voltage VINTA and a ground voltage VSS as a reference voltage for bit line sensing, the reference voltage generator according to example embodiments may use a voltage generated by distributing the voltage of the first node "a" that varies with the drain-source current Ids of the corresponding reference memory cell RM1 as a reference voltage for bit line sensing.

Figure 6:
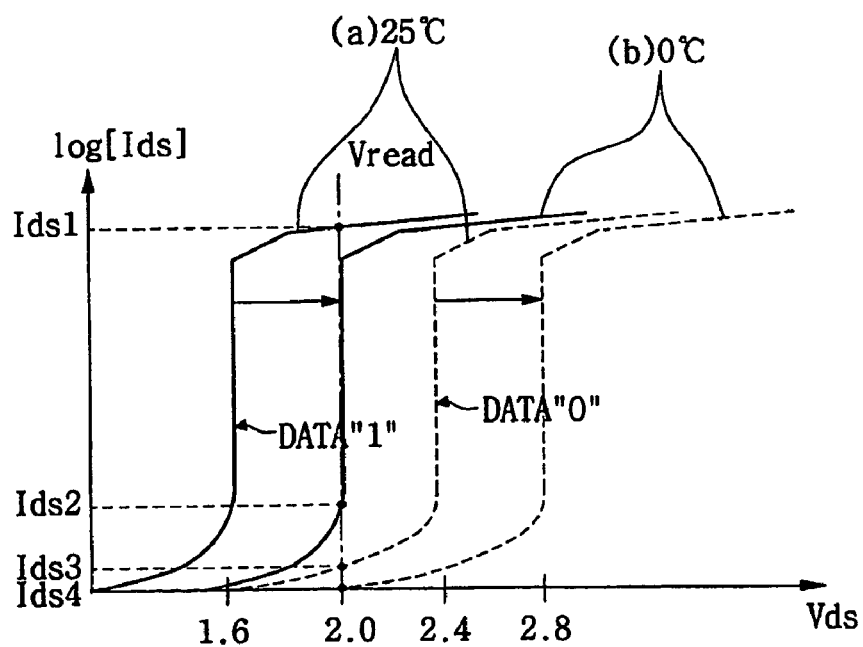
FIG. 6 illustrates a voltage-current curve representing DC characteristics based on temperature variation of a floating body transistor.

FIG. 6 illustrates a voltage-current curve representing DC characteristics based on temperature variation of a floating body transistor. Curve (a) represents DC characteristics at a temperature of 25° C. and curve (b) represents DC characteristics at a temperature of 0° C.

Drain-source voltage Vds is plotted on the horizontal axis and the logarithm of drain-source current Ids is plotted on the vertical axis. A solid curve is a voltage-current characteristic curve for generating a data "1" state and a dotted curve is a voltage-current characteristic curve for generating a data "0" state.

FIG. 6 shows a drain-source current Ids varying with a drain-source voltage Vds of a transistor in the data "1" and "0" states. As can be seen therein, the entire voltage-current characteristic curve (b) is shifted to the right of curve (a), since the drain-source voltage Vds further increases due to temperature characteristics of the transistor when the drain-source current Ids rapidly increases after gradually increasing with the drain-source voltage Vds.

For this particular example, it is assumed that the source line voltage VSL is 2V in curve (a). In this case, at the temperature of 25° C., the logarithm of the drain-source current Ids for generating the data "0" is the first drain-source current Ids1 and the logarithm of the drain-source current Ids for generating the data "1" is a third drain-source current Ids3. Since a margin of a difference between the two currents is sufficiently large at 25° C., the sense amplifier can stably and accurately sense a difference in the current Ids.

However, in a state in which the data ground voltage Vread is 2 V when the temperature is lowered to 0° C. in curve (b), DC characteristics of the floating body transistor are varied. When the drain-source current rapidly increases, the drain-source voltage Vds further increases. In this case, the logarithm of the drain-source current Ids for generating the data "0" is a second drain-source current Ids2 and the logarithm of the drain-source current Ids for generating the data "1" is a fourth drain-source current Ids4. As can be seen in FIG. 6, when the ambient temperature of the semiconductor memory device is below, e.g., 0° C., a difference between the two currents for different data states is very small. Thus, it is difficult to sufficiently secure a margin capable of stably sensing a difference in the current Ids at such temperatures. Since the difference in the current Ids may not be correctly sensed, a read operation of the semiconductor memory device is likely to malfunction.

To overcome this problem, the two resistors R1 and R2 in the target reference voltage generator 110 may receive a voltage at the first node "a" varying with temperature in accordance with the drain-source current Ids from the NMOS transistor, distribute the received voltage at a given ratio, and output a variable target reference voltage that varies with temperature at the second node "b".

At the temperature of 25° C., as indicated by curve (a), a margin of a difference between the first drain-source current Ids1 for generating the data "0" and the third drain-source current Ids3 for generating the data "1" is sufficiently large. Therefore, the sense amplifier can stably and accurately sense a difference in the drain-source current Ids.

However, when a corresponding word line signal transitions to the high level and the NMOS transistor is turned on, the drain-source current Ids flows and a voltage level of the first node "a" is raised. When the ambient temperature of the semiconductor memory device is below, e.g., 0° C., the DC characteristics of the floating body transistor may be varied. As indicated by curve (b), the drain-source voltage Vds increases. Therefore, the entire voltage-current characteristic curve is shifted to the right.

When the drain-source voltage Vds reaches the same level as the source line voltage VSL, e.g., 2.0 V, no current flows into the cell RM1 to generate the data "1" state. The voltage of the first node "a" is increased to and maintained at a voltage (0.4 V) corresponding to a difference between the source line voltage VSL and the first drain-source voltage Vds. Thus, the voltage of the first node "a" may adaptively vary with the ambient temperature of the semiconductor memory device.

The comparator 120 may receive the target reference voltage generated by the target reference voltage generator 110 at the positive terminal, receive the actual bit line precharge voltage VBL actually operating from the precharger (see FIG. 7) at the negative terminal by negative feedback, and compare magnitudes of the two voltages.

When the drain-source voltage Vds is lower than the voltage of the first node "a", an increased bit line precharge voltage VBL may be output. In other words, when the target reference voltage is higher than the actually operating bit line precharge voltage VBL, i.e., when the voltage of the first node "a" in proportion to the target reference voltage is higher than the drain-source voltage Vds, an increased bit line precharge voltage VBL may be output.

When the drain-source voltage Vds is higher than the voltage of the first node "a", a decreased bit line precharge voltage VBL may be output. In other words, when the target reference voltage is lower than the actually operating bit line precharge voltage VBL, i.e., when the voltage of the first node "a" is less than the drain-source voltage Vds, a decreased bit line precharge voltage VBL may be output.

Unlike the conventional reference voltage generator using a fixed voltage as a reference voltage for bit line sensing regardless of the ambient temperature of the semiconductor memory device, the reference voltage generator according to example embodiments may generate a reference voltage of a specific level in accordance with a sensing margin based on bit line sensing characteristics using a voltage generated by distributing the voltage of the first node "a" as the bit line precharge voltage VBL varying with the voltage of the first node "a" according to variation of the ambient temperature.

According to example embodiments, the reference voltage generator 100 may provide a reference voltage having a middle value between the drain-source voltage for generating the data "1" state and the drain-source voltage for generating the data "0" state by adaptively varying a reference voltage according to variation of ambient temperature of the semiconductor memory device, thereby enabling the sense amplifier to sufficiently secure a margin capable of more stably sensing a difference in current Ids. Therefore, a data read operation of the semiconductor memory device may be correctly performed.

Figure 7:
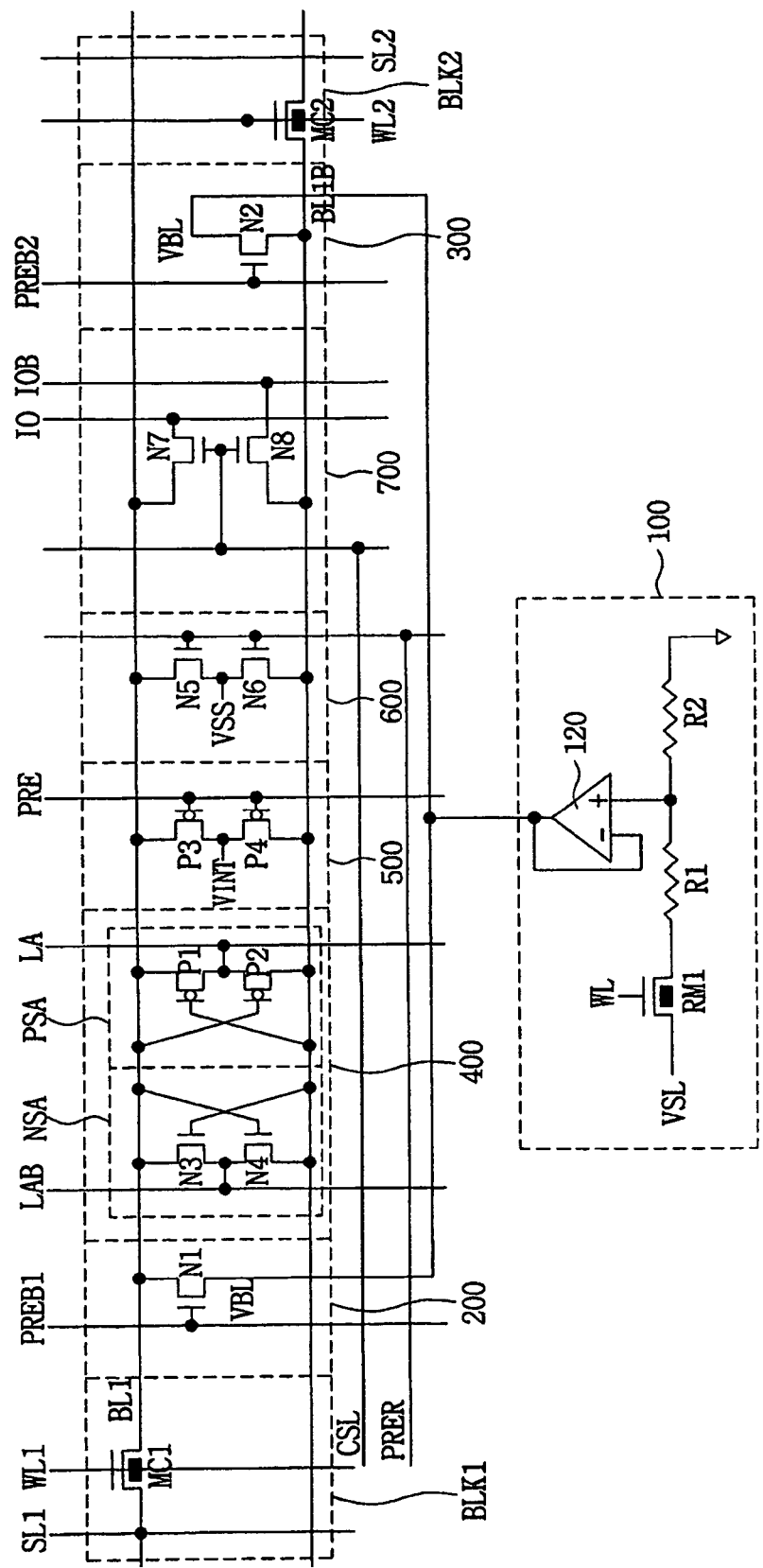
FIG. 7 illustrates a partial block diagram of data write and read operations of a semiconductor memory device including a memory cell with a floating body according to example embodiments.

FIG. 7 illustrates a partial block diagram of data write and read operations of a semiconductor memory device including a memory cell with a floating body according to example embodiments. The semiconductor memory device may include memory cell array blocks BLK1 and BLK2, the reference voltage generator 100, first and second prechargers 200 and 300, a sense amplifier 400, an internal voltage precharger 500, a ground voltage precharger 600, and a column select gate 700.

The memory cell array blocks BLK1 and BLK2 may respectively include memory cells MC1 and MC2 with gates, drains, sources, and floating bodies respectively connected to word lines WL1 and WL2, bit lines BL1 and BL1B, and source lines SL1 and SL2. The first and second prechargers 200 and 300 may respectively include NMOS transistors N1 and N2.

The reference voltage generator 100 may include the reference memory cell RM1, two resistors R1 and R2, and the comparator 120. Since connection relations and functions of the components are the same as in the circuit diagram of the reference voltage generator of the semiconductor memory device shown in FIG. 4, their detailed description may not be repeated.

In order to insure that the reference memory cell RM1 within the reference voltage generator 100 has the same temperature characteristics as the memory cells within the memory cell array blocks BLK1 and BLK2, the reference memory cell RM1 and the memory cells within the memory cell array blocks may be manufactured in the same semiconductor memory manufacturing process. A source line voltage VSL and a word line signal WL applied to the reference memory cell RM1 may be different from voltages of the source lines SL1 and SL2 and signals of word lines WL1 and word lines WL2, i.e., may be separate signals to be activated to generate a reference voltage for bit line sensing when a data read condition is reached.

Two resistors R1 and R2 with the same resistance value are shown, but at least three resistors with difference resistance values may be provided. Also, the resistors may be replaced with a PMOS or NMOS transistor.

The sense amplifier 400 may include a PMOS sense amplifier PSA and an NMOS sense amplifier NSA. The PMOS sense amplifier PSA may include PMOS transistors P1 and P2. The NMOS sense amplifier NSA may include NMOS transistors N3 and N4.

The internal voltage precharger 500 may include PMOS transistors P3 and P4. The ground voltage precharger 600 may include NMOS transistors N5 and N6. The column select gate 700 may include NMOS transistors N7 and N8.

In FIG. 7, the bit line BL1 arranged to the left of the sense amplifier 400 and the complementary bit line BL1B for an inverted bit line signal arranged to the right of the sense amplifier 400 are shown as open-type bit lines. However, the bit lines BL1 and BL1B may be arranged together to the left or right of the sense amplifier and may be folded-type bit lines.

The functions of blocks of the semiconductor memory device shown in FIG. 7 according to example embodiments will be described.

In the memory cell array blocks BLK1 and BLK2, data "1" or "0" is written or read according to a bipolar current flowing into the memory cells MC1 and MC2 selected by the word lines WL1 and WL2, the source lines SL1 and SL2, and the bit lines BL1 and BL1B.

That is, when predetermined voltages are applied to the word lines WL1 and WL2, and a higher voltage than the predetermined voltages is applied to the bit line BL1 during the write operation, the data "0" is written. When the predetermined voltages are applied to the word lines WL1 and WL2, and a lower voltage than the predetermined voltages is applied to the bit line BL1 during the write operation, the data "1" is written.

When the predetermined voltages are applied to the corresponding word lines WL1 and WL2 during the read operation, currents flowing into the bit lines BL1 and BL1B are different and the written data "1" or "0" is read.

The reference memory cell RM1 may generate a drain-source current Ids, which may be divided by the resistors R1 and R2, and output as a generated target reference voltage. The comparator 120 may compare the generated target reference voltage with an actual operating bit line precharge voltage VBL and generate a reference voltage for adaptively variable bit line sensing in accordance with a sensing margin based on the drain-source current Ids and variation of ambient temperature.

The first and second prechargers 200 and 300 may precharge the bit line pair BL1 and BL1B to the precharge voltage VBL in response to precharge control signals PREB1 and PREB2.

The sense amplifier 400 may sense a difference in bipolar current Ids flowing into the bit lines for data written through the selected memory cells MC1 and MC2, and may amplify the sensed difference to a level having a sufficient margin. The PMOS sense amplifier PSA may sense a low-level voltage of one line of the bit line pair BL1 and BL1B, and may amplify the sensed voltage to a sense-amplification voltage LA (1.2 V). The NMOS sense amplifier NSA may sense a high-level voltage of one line of the bit line pair BL1 and BL1B, and may amplify the sensed voltage to an inverted sense-amplification voltage LAB (0 V).

The column select gate 700 may output data between a data line pair D1 and D1B corresponding to the bit line pair BL1 and BL1B in response to a corresponding column select signal output through a column select signal line CSL.

Figure 8:
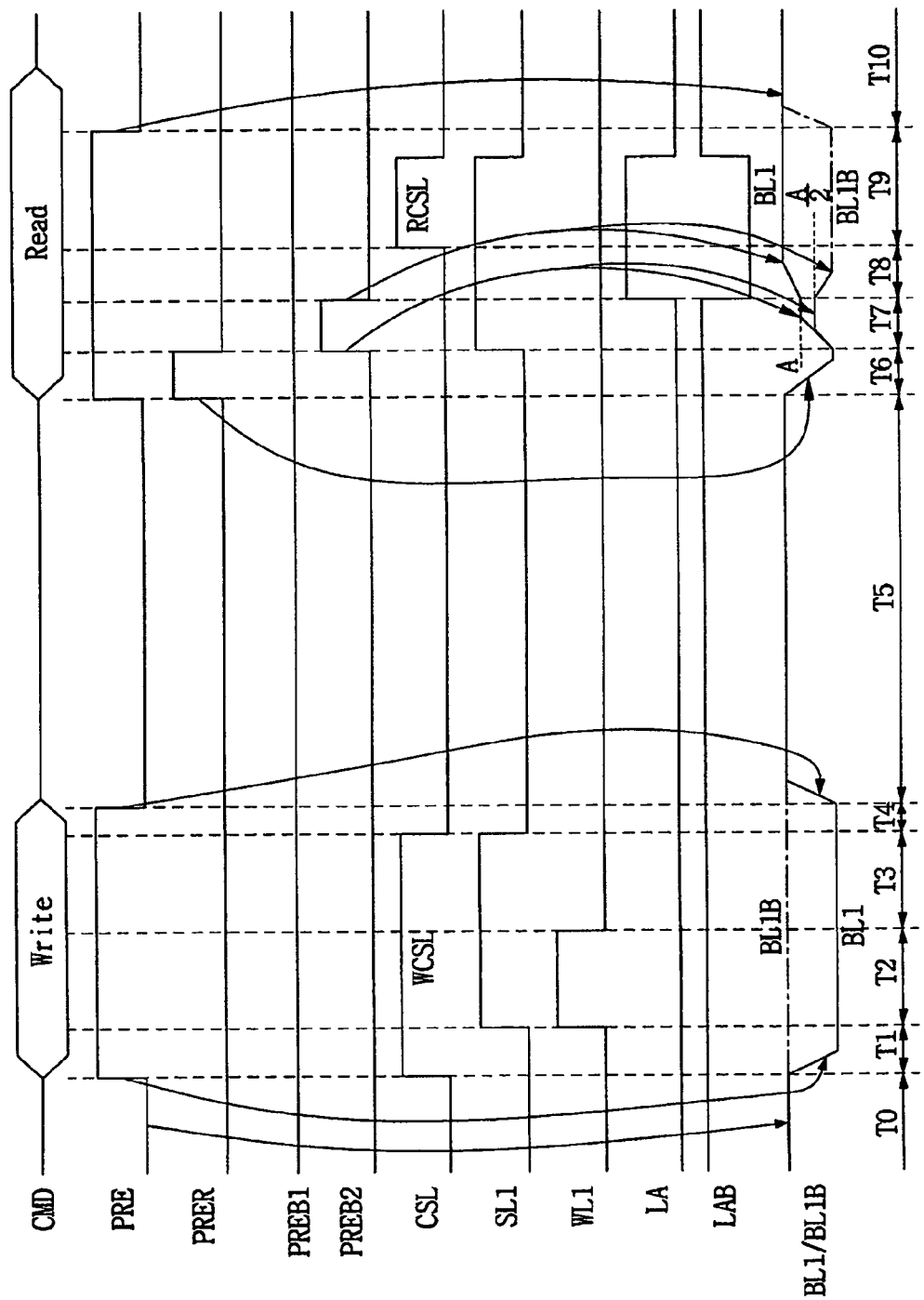
FIG. 8 illustrates an operation timing diagram of the data write and read operations of the semiconductor memory device shown in FIG. 7.

FIG. 8 illustrates an operation timing diagram of the data write and read operations of the semiconductor memory device shown in FIG. 7. The operation timing diagram includes a command signal CMD, a precharge control signal PRE, a read precharge control signal PRER, first and second precharge control signals PREB1 and PREB2, a column select signal line CSL, a source line SL1, a word line WL1, a sense-amplification voltage LA, an inverted sense-amplification voltage LAB, and a bit line pair BL1 and BL1B.

For convenience, an operation for writing and reading data "1" will be described assuming that the data "1" is stored in the memory cells MC1 and MC2 connected to the bit line pair BL1/BL1B and the word line WL1 of the memory cell array block BLK1.

First, when a data write command Write is input from an outside source in period T0, the precharge control signal PRE for initially precharging the bit line pair BL1 and BL1B may be applied at the low level, the write column select signal WCSL1 may be applied at the low level, and the bit line pair BL1 and BL1B may be precharged to an internal voltage VINT.

When the precharge control signal PRE is activated to the high level in period T1, the bit line BL1 may be gradually lowered from the internal voltage VINT. When the write column select signal WCSL1 is activated, the column select gate 700 may be turned on, the data line pair D1 and D1B may be connected to the bit lines BL1 and BL1B, and a pair of low level and high level data of the data line pair D1 and D1B may be output to the bit line pair BL1 and BL1B.

When the source line SL1 and the word line WL1 are activated to the high level in period T2, predetermined voltages, e.g., 2 V and 0 V, may be respectively applied to the source line SL1 and the word line WL1, the memory cell MC1 connected to the word line WL1 and the bit line BL1 may be selected, and the data "1" is written by band-to-band tunneling between a base and a collector of the memory cell.

When the precharge control signal PRE transitions to the low level in order to again precharge the bit line pair BL1 and BL1B in period T5, the bit line pair BL1 and BL1B may be precharged again to the internal voltage VINT and respectively maintained at voltages of 0 V and 1.2 V since the sense amplifiers PSA and NSA do not operate. During a data retention time, the bit line pair BL1 and BL1B may be precharged to the ground voltage without precharging to the internal voltage VINT.

Thereafter, when a data read command Read is input from an outside source in period T6, the precharge control signal PRE and the read precharge control signal PRER transition to the high level and the bit line pair BL1 and BL1B may be lowered from the internal voltage VINT to the ground voltage. When the bit line pair BL1 and BL1B is precharged to the ground voltage during a data retention time in period T5, they do not need to be lowered again to the ground voltage.

When the second precharge control signal PREB2 transitions to the high level in period T7, the bit line BL1 may be raised from the ground voltage to the precharge voltage VBL and the inverted bit line BL1B is raised from the ground voltage to VBL/2. When the source line SL1 transitions to the high level, a predetermined voltage may be applied to the source line SL1 and the memory cell MC1 may be selected.

That is, period T7 is a period in which a voltage difference between the bit line pair BL1 and BL1B arises. When the word line WL1 is activated, the memory cell MC1 connected to the bit line BL1 may be enabled. Since data written to the memory cell MC1 is "1", the voltage of the bit line BL1 is raised to "A" and the voltage of the bit line BL1B is raised to "A/2" corresponding to the precharge voltage VBL, such that bit line sensing may be performed.

When the data written to the memory cell MC1 is "0", the bit line BL may be maintained at 0 V while the bit line BL1B may be raised to "A/2" corresponding to the precharge voltage VBL, such that bit line sensing may be performed.

Consequently, the semiconductor memory device according to example embodiments may stably perform bit line sensing, since a voltage difference of "A/2" is generated between the voltages of the bit line BL1 and the inverted bit line BL1B regardless of the data written to the memory cell MC1.

When the sense-amplification voltages LA and LAB, e.g. 1.2 V and 0 V, for enabling the sense amplifier 400 are respectively applied in period T8, the bit line BL1 may be raised again from the precharge voltage VBL to the internal voltage VINT and the inverted bit line BL1B may be lowered again from VBL/2 to the ground voltage. That is, period T8 is a period in which sensing and amplification operations for the bit line pairs BL1 and BL1B are performed. When the sense-amplification voltages LA and LAB for enabling operation of the sense amplifier 400 are respectively applied, the PMOS sense amplifier PSA and the NMOS sense amplifier NSA arranged to the right of the memory cell array block BLK1 may amplify the bit line pair BL1 and BL1B by performing sensing operations.

When the read column select signal line RCSL1 is activated and transitions to the high level in period T9, data of the bit line pair BL1 and BL1B may be output to the data line pair D1 and D1B. That is, period T9 is a period in which data output and restorage operations for the memory cells MC1 and MC2 are performed. When the read column select signal line RCSL1 is activated, the column select gate 700 may be turned on, the data of the bit line pair BL1 and BL1B may be output to the data line pair D1 and D1B, and the data "1" may be restored in the memory cell MC1 connected between the word line WL1 and the bit line BL1 of the memory cell array block BLK1.

When the precharge control signal PRE transitions again to the low level in period T10, the bit line pair BL1 and BL1B may be precharged again to the internal voltage VINT.

Data write and read operations of the semiconductor memory device according to example embodiments will be described with reference to FIGS. 7 and 8.

Figure 2:
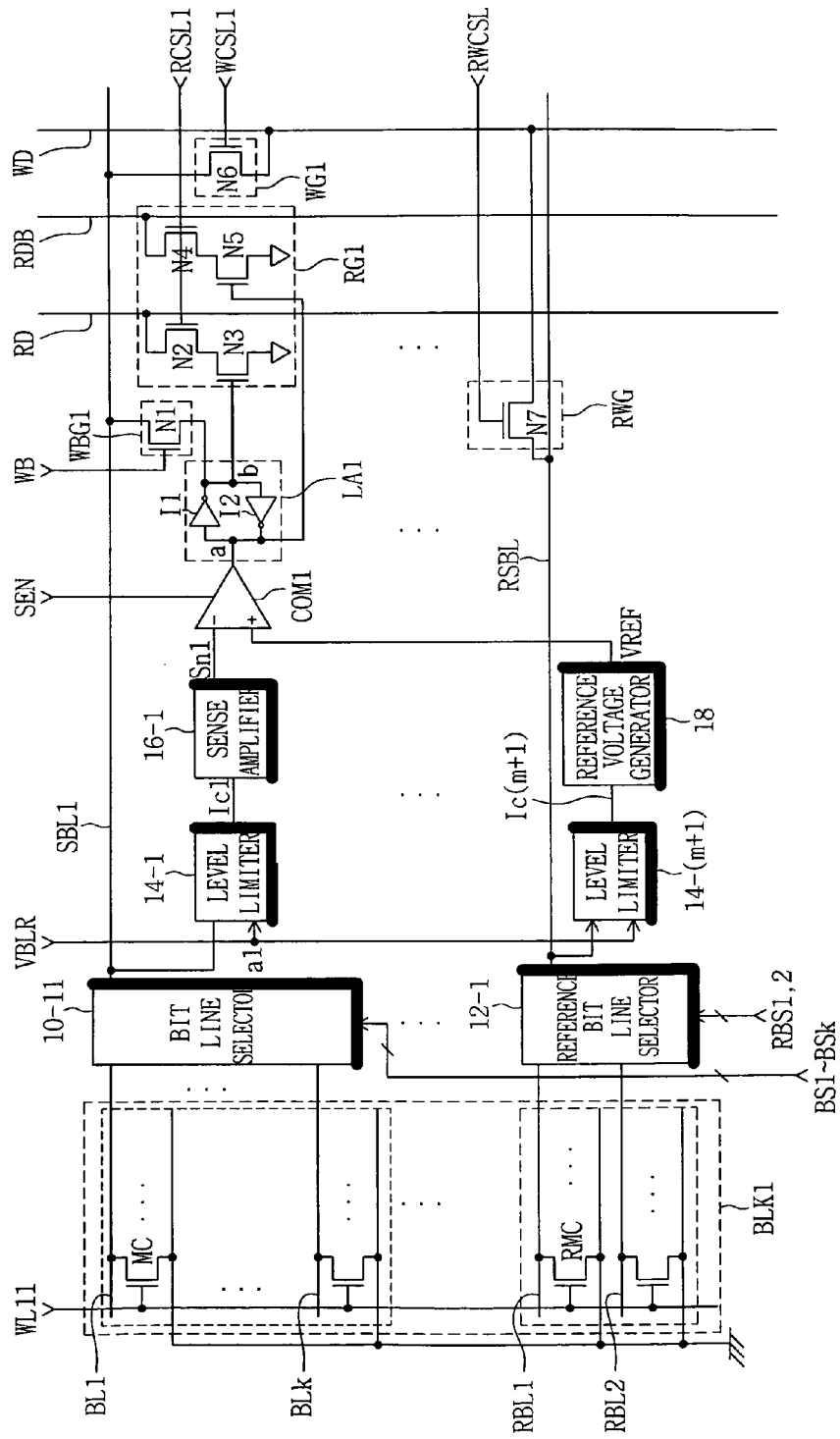
FIG. 2 illustrates a partial block diagram of data write and read operations of a conventional semiconductor memory device including a memory cell with a floating body.

Since an operation for accumulating holes as majority carriers within the floating body of the NMOS transistor configuring the memory cell and using a bipolar current Ids during operations for writing and reading the data "1" and "0" is the same as an operation during write and read operations of the conventional semiconductor memory device shown in FIG. 2, detailed description thereof will not be repeated.

For convenience, an operation for writing and reading data "1" will be described under the assumption that the data "1" is stored in the memory cells MC1 and MC2 connected to the bit line pair BL1 and BL1B and the word line WL1 of the memory cell array block BLK1.

First, when a data write command Write is input from an outside source in period T0, the precharge control signal PRE may be applied at the low level to the gates of the PMOS transistors P3 and P4 within the internal voltage precharger 500, the PMOS transistors P3 and P4 may be turned on, and the bit line pair BL1 and BL1B may be precharged to an internal voltage VINT.

When the precharge control signal PRE is activated to the high level in period T1 and applied to the gates of the PMOS transistors P3 and P4 within the internal voltage precharger 500, the PMOS transistors P3 and P4 may be turned off and the bit line BL1 may be gradually lowered from the internal voltage VINT.

When the write column select signal WCSL1 transitions to the high level and is applied to the gates of the NMOS transistors N7 and N8 within the column select gate 700, the NMOS transistors N7 and N8 may be turned on and the data line pair D1 and D1B may be connected to the bit line pair BL1 and BL1B, and a pair of low- and high-level data of the data line pair D1 and D1B may be output to the bit line pair BL1 and BL1B.

When the source line SL1 and the word line WL1 are activated to the high level in period T2, predetermined voltages may be applied to the source line SL1 and the word line WL1 and the memory cell MC1 is selected. Since it is assumed that the data "1" is stored in the memory cell MC1 in period T0, the drain-source voltage Vds of the memory cell MC1 becomes 2 V, such that the data "1" is written by band-to-band tunneling and/or impact ionization between a base and a collector of the memory cell MC1.

When the precharge control signal PRE transitions to the low level in period T5 and is applied to the gates of the PMOS transistors P3 and P4 within the internal voltage precharger 500, the PMOS transistors P3 and P4 may be turned on and the bit line pair BL1 and BL1B may be precharged again to the internal voltage VINT. When a voltage of 0 V is applied to the source line SL1 and a voltage of −2 V is applied to the word line WL1, a positive electric potential of the floating body of the memory cell MC1 may be lowered. Accordingly, the NPN transistor is turned off, such that the holes accumulated in the floating body may be maintained.

When the voltage of −2 V is applied to the word line WL1, the memory cell storing the data "1" may be turned off and the stored data is maintained. Since the PMOS sense amplifier PSA and the NMOS sense amplifier NSA do not operate during the data write time, the bit lines BL1 and BL1B respectively maintain low-level data and high-level data.

Next, an operation for reading the data "1" from the memory cell MC1 connected to the bit line pair BL1 and BL1B and the word line WL1 of the memory cell array block BLK1 will be described.

When the precharge control signal PRE transitions again to the high level in response to a data read command Read in period T6 and is applied to the gates of PMOS transistors P3 and P4 within the internal voltage precharger 500, the PMOS transistors P3 and P4 may be turned off. When the read precharge control signal PRER transitions to the high level and is applied to the NMOS transistors N5 and N6 within the ground voltage precharger 600, the NMOS transistors N5 and N6 may be turned on and the bit line pair BL1 and BL1B may be precharged to the ground voltage.

Meanwhile, the reference voltage generator 100 may receive a drain-source current Ids from the reference memory cell RM1 when the source line voltage VSL and the word line signal WL are activated to generate the reference voltage for bit line sensing if the above-described data read condition is reached, compare a generated target reference voltage with an actually operating bit line precharge voltage VBL, and generate a reference voltage for adaptively variable bit line sensing in accordance with a sensing margin based on the drain-source current Ids and variation of ambient temperature.

Period T7 is a period in which a voltage difference between the bit line pair BL1 and BL1B develops. A reference voltage difference between the bit line BL1 and the inverted bit line BL1B is generated, such that stable bit line sensing may be performed.

That is, when the second precharge control signal PREB2 transitions to the high level in period T7 and is applied to the NMOS transistor N2 of the second precharger 300, the NMOS transistor N2 may be turned on and the bit line BL1 may be raised from the ground voltage to A (=2VBL) and the inverted bit line BL1B may be raised from the ground voltage to the reference voltage (A/2). When the source line SL1 transitions to the high level, a predetermined voltage may be applied to the source line SL1 and the corresponding memory cell MC1 may be selected.

When the data written to the memory cell MC1 is "0", the voltage of the bit line BL1 is directly maintained at 0 V and the voltage of the inverted bit line BL1B may be raised to A/2 corresponding to the reference voltage, such that bit line sensing may be performed.

Period T8 is a period in which the PMOS sense amplifier PSA and the NMOS sense amplifier NSA perform sensing and amplification operations. Voltages of the bit line pairs BL1 and BL1B may be 1.2 V and 0 V, respectively.

That is, when the second precharge control signal PREB2 transitions again to the low level in a state in which the sense-amplification voltages for enabling the sense amplifier 400 respectively transition to 1.2 V and 0 V in period T8, the NMOS transistor N2 is turned off. When a signal of the bit line BL1 raised to 2VBL is applied to the NMOS transistor N4 of the NMOS sense amplifier NSA, the NMOS transistor N4 may be turned on and the sense-amplification voltage of 0 V may be output to the inverted bit line BL1B. When a signal of the inverted bit line BL1B with the lower reference voltage than a threshold voltage is applied to the PMOS transistor P1, the PMOS transistor P1 may be turned on and the sense-amplification voltage LA of 1.2 V may be output to the bit line BL1.

Period T9 is a period in which data output and restorage operations of the memory cell MC1 may be performed.

That is, when the read column select signal line RCSL1 transitions to the high level in period T9 and is applied to the gates of the NMOS transistors N7 and N8 within the column select gate 700, the NMOS transistors N7 and N8 may be turned on, the data line pair D1 and D1B may be connected to the bit line pair BL1 and BL1B, and data of the bit line pair BL1 and BL1B may be output to the data line pair D1 and D1B.

When the precharge control signal PRE transitions again to the low level in period T10, the bit line pair BL1 and BL1B may be precharged again to the internal voltage VINT. The data "1" may be restored in the memory cell MC1 connected between the word line WL1 and the bit line BL1 when the data restorage operation of the memory cell MC1 is performed in period T9.

Figure 9:
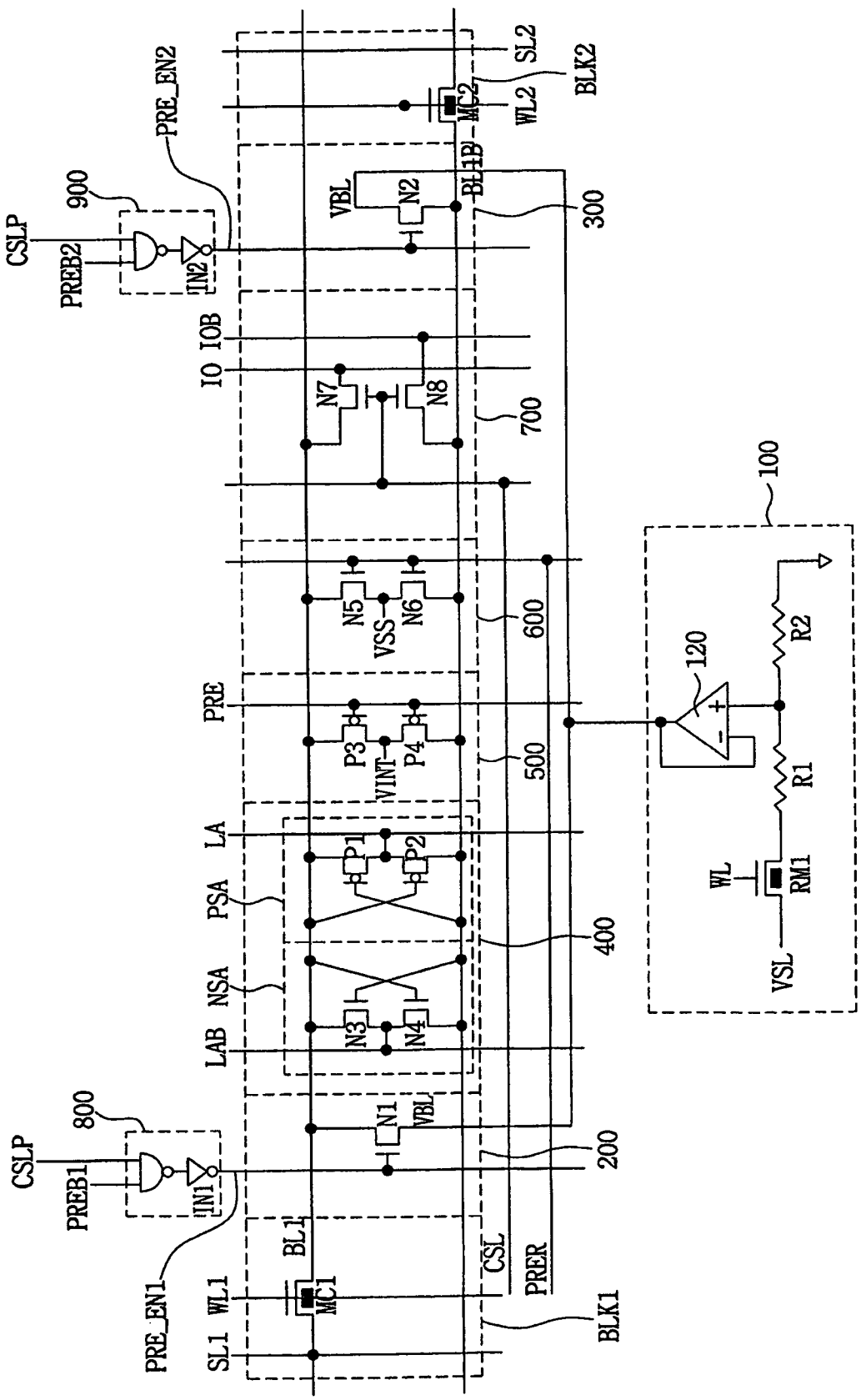
FIG. 9 illustrates a partial block diagram of data write and read operations of a semiconductor memory device including a memory cell with a floating body according to other example embodiments.

FIG. 9 illustrates a partial block diagram of data write and read operations of a semiconductor memory device including a memory cell with a floating body according to other example embodiments. The semiconductor memory device includes memory cell array blocks BLK1 and BLK2, the reference voltage generator 100, first and second prechargers 200 and 300, the sense amplifier 400, the internal voltage precharger 500, the ground voltage precharger 600, the column select gate 700, and first and second precharge controllers 800 and 900.

Unlike the semiconductor memory device for the data write and read operations shown in FIG. 7, the semiconductor memory device shown in FIG. 9 may further include the first and second precharge controllers 800 and 900 in which NAND gates NAND1 and NAND2 may be connected to inverters IN1 and IN2 in series.

The first and second precharge controllers 800 and 900 may receive precharge control signals PREB1 and PREB2 and a column select signal pulse CSLP. The first and second prechargers 200 and 300 may be activated and precharge enable signals PRE_EN1 and PRE_EN2 for writing and reading only data of a selected bit line pair may be output only when the two signals are applied at the high level.

Since the other blocks function the same as in the semiconductor memory device shown in FIG. 7, the description thereof will not be repeated.

Figure 10:
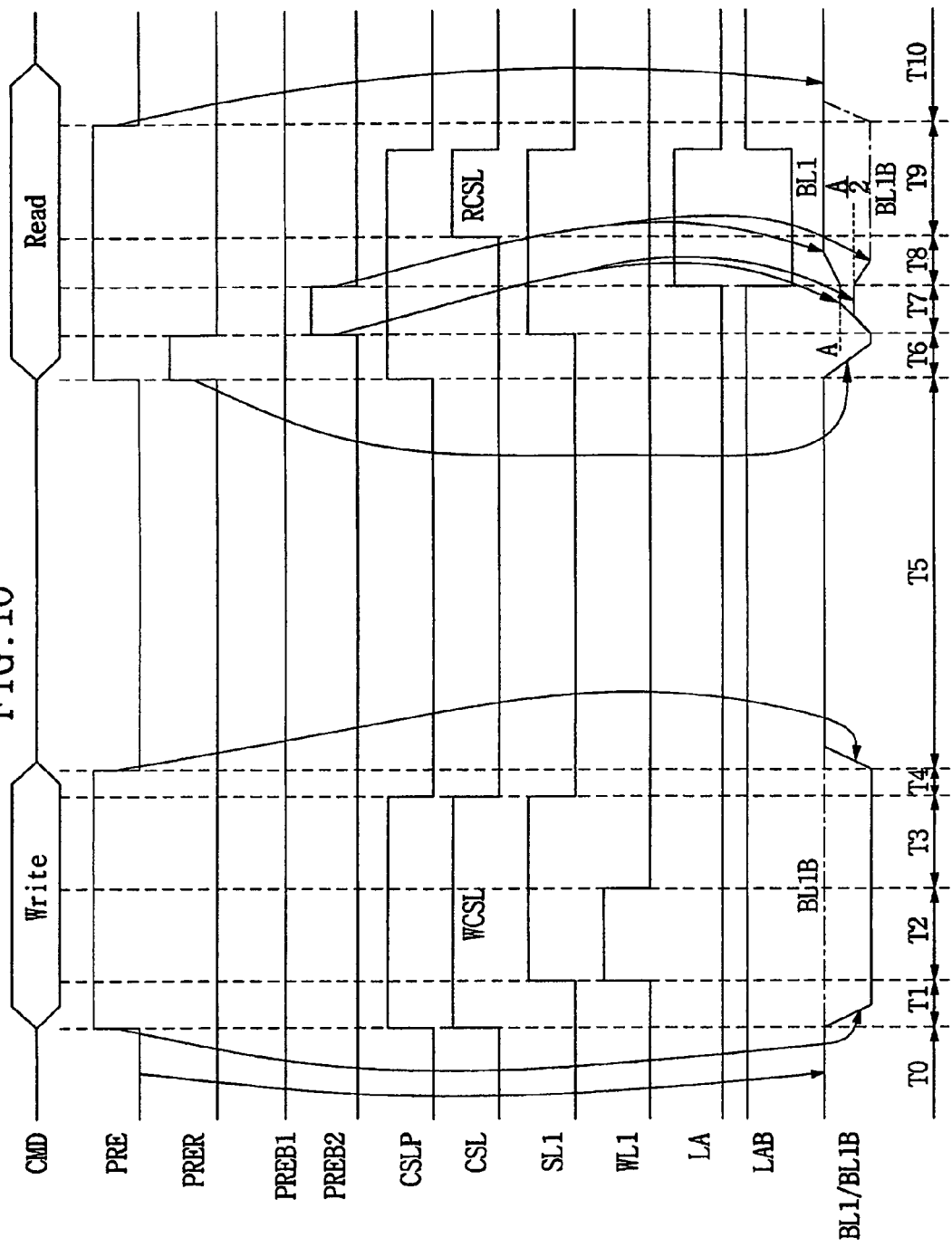
FIG. 10 illustrates an operation timing diagram of the data write and read operations of the semiconductor memory device shown in FIG. 9.

Next, FIG. 10 illustrates an operation timing diagram of the data write and read operations of the semiconductor memory device shown in FIG. 9. The operation timing diagram includes a command signal CMD, a precharge control signal PRE, a read precharge control signal PRER, a column select signal pulse CSLP, first and second precharge control signals PREB1 and PREB2, a column select signal line CSL, a source line SL1, a word line WL1, a sense-amplification voltage LA, an inverted sense-amplification voltage LAB, and a bit line pair BL1 and BL1B.

Unlike the operation timing diagram of the semiconductor memory device shown in FIG. 8, the operation timing diagram shown in FIG. 10 may further include the column select signal pulse CSLP for controlling an operation for reading only data of a corresponding bit line pair selected during the data write and read operations.

Since an operation for writing the data "1" to the memory cells MC1 and MC2 within the memory cell array block BLK1 is the same as the data write operation of the semiconductor memory device shown in FIG. 7, only an operation for reading the data "1" from the memory cells MC1 and MC2 will be described.

When a data read command Read is input from an outside source, the precharge control signal PRE and the read precharge control signal PRER may transition to the high level in period T6, and the bit line pair BL1 and BL1B may be lowered from an internal voltage VINT to a ground voltage. At this time, the column select signal pulse CSLP may transition to the high level.

When the second precharge control signal PREB2 transitions to the high level in a state in which the column select signal pulse CSLP is maintained at the high level in period T7, the bit line BL1 may be raised from the ground voltage to the precharge voltage VBL and the inverted bit line BL1B may be raised from the ground voltage to VBL/2. When the source line SL1 transitions to the high level, a predetermined voltage may be applied to the source line SL1 and the memory cell MC1 may be selected.

Since an operation in which the bit line BL1 is raised again to the internal voltage VINT and the inverted bit line BL1B is lowered again to the ground voltage in period T8, an operation in which data of the bit line pair BL1 and BL1B are output to the corresponding data line pair D1 and D1B in period T9, and an operation in which the bit line pair BL1 and BL1B are precharged again to the internal voltage VINT in period T10, are the same as shown in the operation timing diagram of the semiconductor memory device shown in FIG. 8, a detailed description thereof is not repeated.

The data write and read operations of the semiconductor memory device according to the other example embodiments will be described with reference to FIGS. 9 and 10.

Since the operation for writing the data "1" to the memory cell MC1 connected to the bit line pairs BL1 and BL1B and the word line WL1 of the memory cell array block BLK1 is the same as the data write operation of the semiconductor memory device shown in FIG. 7, only an operation for reading the data "1" from the memory cell MC1 will be described.

When the precharge control signal PRE transitions again to the high level in response to a data read command Read in period T6 and is applied to gates of PMOS transistors P3 and P4 within the internal voltage precharger 500, the PMOS transistors P3 and P4 may be turned off. When the read precharge control signal PRER transitions to the high level and is applied to NMOS transistors N5 and N6 within the ground voltage precharger 600, the NMOS transistors N5 and N6 may be turned on and the bit line pair BL1 and BL1B may be precharged to the ground voltage. This operation is the same as the data read operation of the semiconductor memory device shown in FIGS. 7 and 8. Unlike the data read operation of the semiconductor memory device shown in FIGS. 7 and 8, the column select signal pulse CSLP may also transition to the high level in period T6.

Similarly, the reference voltage generator 100 may receive a drain-source current Ids from a reference memory cell RM1 when the source line voltage VSL and the word line signals WL may be activated to generate a reference voltage for bit line sensing if the above-described data read condition is reached, compare a generated target reference voltage with an actual operating bit line precharge voltage VBL, and generate a reference voltage for adaptively variable bit line sensing in accordance with a sensing margin based on the drain-source current Ids and variation of ambient temperature.

Period T7 is a period in which a voltage difference between the bitline pair BL1 and BL1B develops. A reference voltage difference between the bit line BL1 and the inverted bit line BL1B is generated, such that stable bit line sensing may be performed. This operation has the following differences from the data read operation of the semiconductor memory device shown in FIGS. 7 and 8.

Along with the column select signal pulse CSLP, the second precharge control signal PREB2 may be applied via the second precharge controller 900 without being directly applied to the NMOS transistor N2. When both signals are applied at the high level, the second precharger 300 may be activated and only data of a selected bit line pair is written and read.

That is, since the second precharger 300 may not be activated in a state in which the column select signal pulse CSLP is maintained at the low level before period T6, the inverted bit line BL1B is not raised from the ground voltage to the reference voltage. In a state in which the column select signal pulse CSLP transitions to the high level in period T6 and is maintained at the high level in period T7, the second precharger 300 is activated only when the second precharge control signal PREB2 transitions to the high level and is applied to the second precharger controller 900, and the inverted bit line BL1B is raised from the ground voltage to the reference voltage.

In other words, the NAND gate NAND2 within the second precharge controller 900 may receive the second precharge control signal PREB2 and the column select signal pulse CSLP and perform a NAND operation thereon. Then, the inverter IN2 may output a precharge enable signal PRE_EN2. The second precharge enable signal PRE_EN2 may be output at the high level only when the two signals are applied at the high level and may be applied to the gate of the NMOS transistor N2 within the second precharger 300. The NMOS transistor N2 may be turned on and the inverted bit line BL1B may be raised from the ground voltage to the reference voltage.

Data of a selected bit line pair only is read and data of a non-selected bit line pair is not read. Therefore, power consumed in writing and reading data may be reduced in the semiconductor memory device including a memory cell with a floating body.

Since an operation in which the PMOS sense amplifier PSA and the NMOS sense amplifier NSA perform sensing and amplification operations in period T8 and data output and restorage operations of the memory cells MC1 and MC2 in period T9 are the same as in data write and read operations of the semiconductor memory device shown in FIGS. 7 and 8, the description thereof will not be repeated.

In the semiconductor memory device including a memory cell with a floating body according to example embodiments, unlike in the conventional semiconductor memory device, the reference voltage generator 100 configured to generate a reference voltage for bit line sensing is not included in a bit line sense amplifier, thereby preventing an increase in the size of the bit line sense amplifier and preventing an increase in the size of a memory array, since a dummy cell configured with reference memory cells is not added to the memory array.

Example embodiments do not need complex circuits of a level limiter, a comparator, a latch, a write back gate, a read column select gate, a write column select gate, a reference write column select gate, etc., typically required to perform a data read operation in the conventional semiconductor memory device. Also, power consumption required to write and read data may be reduced by reading only data of a selected bit line pair.

Unlike the reference voltage generation of the conventional floating body transistor, i.e., using a fixed voltage of a middle level between an internal voltage VINTA and a ground voltage VSS as a reference voltage for bit line sensing, the semiconductor memory device including a memory cell with a floating body according to example embodiments is adaptive to variation in a drain-source current Ids of a corresponding reference memory cell RM1, such that a bit line sense amplifier may stably and correctly senses a current difference.

When the semiconductor memory device is placed in an abnormal environment, e.g., where the ambient temperature is very different from normal room temperature, a voltage adaptively varying with DC characteristics of a floating body transistor is used as a reference voltage for bit line sensing, such that a sense amplifier may sufficiently secure a margin capable of stably sensing a current difference and a read operation of the semiconductor memory device may be correctly performed.

A simultaneous data read operation for memory cells connected to two source lines SL1 and SL2 and one bit line pair BL1 and BL1B has been described in the above example embodiments. When a memory cell array includes a plurality of memory cell array banks, a simultaneous read operation for memory cells connected to a plurality of source lines and a plurality of bit line pairs of a memory cell array bank may be performed. The above-described temperatures and voltages may be replaced with other temperatures and voltages within predetermined ranges as appropriate.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor memory device, comprising:
a plurality of memory cell array blocks connected to word lines, source lines, and bit lines, each memory cell array block including memory cells each having a transistor with a floating body and being configured to write/read data by performing a bipolar junction transistor operation for selected memory cells;
a reference voltage generator including a reference memory cell, the reference voltage generator configured to generate a reference voltage for bit line sensing corresponding to a current flowing to the reference memory cell during a data read operation, the reference memory cell including a first terminal configured to receive a source line voltage, a gate terminal configured to receive a word line signal, and a second terminal directly coupled to a terminal of at least one of the resistors;
first and second prechargers configured to precharge a bit line connected to non-selected memory cells to the reference voltage in response to first and second precharge control signals during the data read operation; and
a sense amplifier configured to sense and amplify a voltage difference between a bit line connected to the selected memory cells and a bit line connected to the non-selected memory cells during the data read operation.

2. The semiconductor memory device as claimed in claim 1, further comprising:
an internal voltage precharger configured to precharge a bit line pair of the bit line connected to the selected memory cells and the bit line connected to the non-selected memory cells to an internal voltage in response to a precharge control signal;
a ground voltage precharger configured to precharge the bit line pair to a ground voltage in response to a read precharge control signal; and
a column select gate configured to output data between the bit line pair and a data line pair in response to a column select signal.

3. The semiconductor memory device as claimed in claim 2, wherein the internal voltage precharger comprises:
p-channel metal oxide semiconductor (PMOS) transistors having first terminals connected to the bit line pair and second terminals connected to the internal voltage, the PMOS transistors being configured to be:
turned on when a precharge control signal having a low level is initially received through gate terminals to precharge the bit line pair to the internal voltage,
turned off when the precharge control signal transitions to a high level in response to a data write command and is applied to the gate terminals to lower the bit line pair to a voltage of written data, and
turned on when the precharge control signal transitions again to a low level after data is written to the memory cells and is applied to the gate terminals to precharge the bit line pair again to the internal voltage.

4. The semiconductor memory device as claimed in claim 3, wherein the PMOS transistors are configured to be:
turned off when the read precharge control signal transitions to the high level in response to a data read command and is applied to the gate terminals after data is read from the memory cells to change the bit line pair to the ground voltage, and
turned on when the precharge control signal transitions again to the low level after data is read from the memory cells and is applied to the gate terminals to precharge the bit line pair to the internal voltage.

5. The semiconductor memory device as claimed in claim 4, wherein the ground voltage precharger comprises:
n-channel metal oxide semiconductor (NMOS) transistors having first terminals connected to the bit line pair and second terminals connected to the ground voltage, the NMOS transistors being configured to be:
turned on when a read precharge control signal having a high level is applied to gate terminals in response to the data read command to precharge the bit line pair to the ground voltage, and
turned off when the read precharge control signal transitions to the low level and is applied to the gate terminals at a time at which the second precharge control signal transitions to the high level.

6. The semiconductor memory device as claimed in claim 5, wherein the second precharger comprises:
an NMOS transistor having a first terminal connected to the bit line pair and a second terminal connected to the reference voltage, the NMOS transistor being configured to be turned on when the second precharge control signal transitions to the high level in response to the data read command and is applied to a gate terminal of the NMOS transistor to raise an inverted bit line signal from the ground voltage to the reference voltage.

7. The semiconductor memory device as claimed in claim 6, wherein the sense amplifier comprises:
a PMOS sense amplifier configured to sense a low-level voltage of one line of the bit line pair and amplify the sensed voltage to a sense-amplification voltage; and
an NMOS sense amplifier configured to sense a high-level voltage of one line of the bit line pair and amplify the sensed voltage to an inverted sense-amplification voltage.

8. The semiconductor memory device as claimed in claim 7, wherein the column select gate comprises:
NMOS transistors having first terminals connected to the bit line pair and second terminals connected to the data line pair, the NMOS transistors being configured to be turned on when a read column select signal line transitions to the high level and is applied to gate terminals to connect the data line pair to the bit line pair and output data of the bit line pair to the data line pair.

9. The semiconductor memory device as claimed in claim 8, wherein the reference voltage generator comprises:
a target reference voltage generator configured to receive a source line voltage and generate a target reference voltage in response to a word line signal; and
a comparator configured to receive the target reference voltage and a presently operating bit line precharge voltage, compare the two voltages, and output a variable bit line precharge voltage as the reference voltage.

10. The semiconductor memory device as claimed in claim 9, wherein the target reference voltage generator comprises:
the reference memory cell configured to receive the source line voltage at a first terminal, receive the word line signal through a gate terminal, induce a current at a second terminal and write and read data; and
a plurality of resistors connected in series between the reference memory cell and a ground, the plurality of resistors being configured to receive the current, distribute a voltage, and generate the target reference voltage.

11. The semiconductor memory device as claimed in claim 10, wherein the plurality of resistors are configured with at least one of a PMOS transistor and an NMOS transistor.

12. The semiconductor memory device as claimed in claim 11, wherein the reference memory cell has the same voltage and current characteristics based on temperature variation as the memory cells that actually operate.

13. The semiconductor memory device as claimed in claim 12, wherein the reference memory cell is configured with an NMOS transistor configured to be:
   turned on when the word line signal is initially applied at the high level to write and store data "1",
   turned off when the word line signal transitions to the low level to maintain the other side at the ground voltage, and
   turned on when the word line signal transitions again to the high level to output the source line voltage and induce the current.

14. The semiconductor memory device as claimed in claim 13, wherein, when the NMOS transistor is turned on to induce the current and a drain-source voltage transitions from an initial source line voltage to a voltage at which no current flows, the target reference voltage generator is configured to maintain a voltage by raising the voltage of the other side of the NMOS transistor from the ground voltage to double the reference voltage.

15. The semiconductor memory device as claimed in claim 14, wherein, when an ambient temperature of the semiconductor memory device varies, a shift is made until the drain-source voltage has the same level as the source line voltage, and no current flows into a cell to generate a data "1" state, the target reference voltage generator maintains the voltage by raising the voltage of the other side of the NMOS transistor from the ground voltage to double the reference voltage.

16. The semiconductor memory device as claimed in claim 15, wherein the comparator receives the generated target reference voltage through a positive terminal, receives the actually operating bit line precharge voltage by negative feedback through a negative terminal and compares the two voltages,
   the reference voltage is raised and output when the generated target reference voltage is higher than the actually operating bit line precharge voltage, and
   the reference voltage is lowered and output when the generated target reference voltage is lower than the actually operating bit line precharge voltage.

17. The semiconductor memory device as claimed in claim 16, further comprising first and second precharge controllers configured to:
   receive the first and second precharge control signals and a column select signal pulse,
   activate the first and second prechargers only when both the first precharge control signal and the column select signal pulse, or the second precharge control signal and the column select signal pulse, are applied at the high level, and
   output first and second precharge enable signals for writing and reading only data of a selected bit line pair.

18. The semiconductor memory device as claimed in claim 17, wherein each of the first and second precharge controllers comprises:
   an NAND gate configured to receive one of the first and second precharge control signals and the column select signal pulse, perform a NAND operation thereon, and output a NAND operation signal; and
   an inverter configured to receive and invert the NAND operation signal and output the inverted signal as one of the first and second precharge enable signals.

19. A semiconductor memory device, comprising:
   a plurality of memory cell array blocks connected to word lines, source lines, and bit lines, each memory cell array block including memory cells each having a transistor with a floating body and being configured to write/read data by performing a bipolar junction transistor operation for selected memory cells;
   a reference voltage generator including a reference memory cell and a plurality of resistors, the reference voltage generator configured to generate a reference voltage for bit line sensing corresponding to a current flowing to the reference memory cell during a data read operation, the reference memory cell configured to receive a source line voltage at a first terminal, receive a word line signal through a gate terminal, induce a current at a second terminal and write and read data;
   a plurality of resistors connected in series between the reference memory cell and a ground, the plurality of resistors being configured to receive the current from the reference memory cell, distribute a voltage, and generate the target reference voltage;
   first and second prechargers configured to precharge a bit line connected to non-selected memory cells to the reference voltage in response to first and second precharge control signals during the data read operation; and
   a sense amplifier configured to sense and amplify a voltage difference between a bit line connected to the selected memory cells and a bit line connected to the non-selected memory cells during the data read operation.

20. A semiconductor memory device, comprising:
   a plurality of memory cell array blocks connected to word lines, source lines, and bit lines, each memory cell array block including memory cells each having a transistor with a floating body and being configured to write/read data by performing a bipolar junction transistor operation for selected memory cells;
   a reference voltage generator including a reference memory cell, the reference voltage generator configured to generate a reference voltage for bit line sensing corresponding to a current flowing to the reference memory cell during a data read operation;
   first and second prechargers configured to precharge a bit line connected to non-selected memory cells to the reference voltage in response to first and second precharge control signals during the data read operation; and
   a sense amplifier configured to sense and amplify a voltage difference between a bit line connected to the selected memory cells and a bit line connected to the non-selected memory cells during the data read operation,
   wherein the reference voltage generator includes:
      a target reference voltage generator including the reference memory cell, the reference memory cell being configured to receive a source line voltage and generate a target reference voltage in response to a word line signal and induce a current at a terminal thereof, and
      a plurality of resistors connected in series between the reference memory cell and a ground, the plurality of resistors being configured to receive the current induced from the reference memory cell, distribute a voltage, and generate the target reference voltage,
      a comparator configured to receive the target reference voltage and a presently operating bit line precharge voltage, compare the two voltages, and output a variable bit line precharge voltage as the reference voltage.

* * * * *